(12) United States Patent
Chen et al.

(10) Patent No.: US 10,546,824 B2
(45) Date of Patent: *Jan. 28, 2020

(54) LIGHT-EMITTING DEVICE

(71) Applicant: EPISTAR CORPORATION, Hsinchu (TW)

(72) Inventors: Chao Hsing Chen, Hsinchu (TW); Chien Fu Shen, Hsinchu (TW); Tsun Kai Ko, Hsinchu (TW); Schang Jing Hon, Hsinchu (TW); Hsin Mao Liu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/881,395

(22) Filed: Jan. 26, 2018

(65) Prior Publication Data

US 2018/0151516 A1 May 31, 2018

Related U.S. Application Data

(63) Continuation of application No. 14/874,063, filed on Oct. 2, 2015, now Pat. No. 9,893,024, which is a (Continued)

(51) Int. Cl.
*H01L 23/60* (2006.01)
*H01L 33/62* (2010.01)
(Continued)

(52) U.S. Cl.
CPC .......... *H01L 23/60* (2013.01); *H01L 25/0753* (2013.01); *H01L 27/156* (2013.01); (Continued)

(58) Field of Classification Search
CPC ... H01L 23/60; H01L 25/0753; H01L 27/156; H01L 27/153; H01L 27/60; H01L 27/62; H01L 33/62
See application file for complete search history.

(56) References Cited

U.S. PATENT DOCUMENTS 4,538,342 A 9/1985 Camlibel et al.
5,789,768 A 8/1998 Lee et al.
(Continued)

FOREIGN PATENT DOCUMENTS

DE 102008005935 A1 6/2009
JP 2005136177 A 5/2005
(Continued)

*Primary Examiner* — Jose R Diaz
(74) *Attorney, Agent, or Firm* — Patterson + Sheridan, LLP

(57) ABSTRACT

The present disclosure provides a light emitting device including an LED array including a plurality of LED cells connected in series disposed on a single substrate; wherein each LED cell includes a first edge, a second edge, a third edge, and a fourth edge, and wherein the LED array includes a first LED and a second LED, the first edge of the first LED is adjacent to the third edge of the second LED; a first trench, disposed between the first LED cell and the second LED; and a first conducting metal, disposed on the first trench, the first edge of the first LED and the third edge of the second LED, and electrically connecting the first LED and the second LED in series; wherein the first LED and/or the second LED includes a round corner in a top view.

20 Claims, 12 Drawing Sheets

Related U.S. Application Data continuation of application No. 13/198,396, filed on Aug. 4, 2011, now Pat. No. 9,178,883.

(60) Provisional application No. 61/378,191, filed on Aug. 30, 2010.

(51) Int. Cl.
*H01L 27/15* (2006.01)
*H01L 25/075* (2006.01)
*H05B 33/08* (2006.01)

(52) U.S. Cl.
CPC ............ *H01L 33/62* (2013.01); *H05B 33/089* (2013.01); *H01L 27/153* (2013.01); *H01L 2924/0002* (2013.01); *Y02B 20/341* (2013.01)

(56) References Cited

U.S. PATENT DOCUMENTS

| | | | |
|---|---|---|---|
| 7,749,860 B2 | 7/2010 | Gonzalez et al. | |
| 9,171,883 B2* | 10/2015 | Chen | H01L 23/60 |
| 9,893,024 B2* | 2/2018 | Chen | H01L 23/60 |
| 2001/0046753 A1 | 11/2001 | Gonzalez et al. | |
| 2002/0139987 A1 | 10/2002 | Collins et al. | |
| 2003/0178627 A1* | 9/2003 | Marchl | H01L 25/0753 257/80 |
| 2005/0017371 A1 | 1/2005 | Wang et al. | |
| 2007/0284593 A1 | 12/2007 | Ko et al. | |
| 2008/0179602 A1 | 7/2008 | Negley et al. | |
| 2009/0050907 A1 | 2/2009 | Yuan et al. | |
| 2009/0152683 A1 | 6/2009 | Nguyen et al. | |
| 2009/0289345 A1 | 11/2009 | Tsai et al. | |
| 2010/0109030 A1 | 5/2010 | Krames et al. | |
| 2010/0273309 A1 | 10/2010 | Gonzalez et al. | |
| 2010/0317132 A1 | 12/2010 | Rogers et al. | |

FOREIGN PATENT DOCUMENTS

| | | |
|---|---|---|
| JP | 2005183911 A | 7/2005 |
| JP | 3117281 U | 1/2006 |
| JP | 2006228855 A | 8/2006 |
| JP | 2007311781 A | 11/2007 |
| JP | 2009238893 A | 10/2009 |
| JP | 2010517273 A | 5/2010 |
| JP | 2010238999 A | 10/2010 |
| KR | 101273177 B1 | 6/2013 |
| TW | 200614486 | 5/2006 |
| TW | 200837943 A | 9/2008 |
| TW | 200947753 A | 11/2009 |

* cited by examiner

LIGHT-EMITTING DEVICE

REFERENCE TO RELATED APPLICATION

This application a continuation application of U.S. patent application Ser. No. 14/874,063, entitled "LIGHT EMITTING DEVICE", filed on Oct. 2, 2015 which is a continuation application of U.S. patent application Ser. No. 13/198,396, entitled "LIGHT EMITTING DEVICE", filed on Aug. 4, 2011, which claims the right of priority based on U.S. provisional application Ser. No. 61/378,191, filed on Aug. 30, 2010, and the content of both applications are hereby incorporated by reference in its entirety.

TECHNICAL FIELD

The disclosure relates to a light emitting device, and more particularly to a light emitting device with the ability of electrostatic discharge (ESD) protection.

DESCRIPTION OF BACKGROUND ART

FIG. 1 shows an illustration of a light emitting device 10. The light emitting device 10 comprises a plurality of LED cells 11 (A, B, C, C1, C2, C3) connecting in series by conducting metals 13 on a single substrate 15, wherein each LED cell 11 comprises a first semiconductor layer 17 on the substrate 15, a second semiconductor layer 19 on the first semiconductor layer 17, an active layer 47 (not shown in FIG. 1) arranged between the first semiconductor layer 17 and the second semiconductor layer 19, and a conducting metal 13 arranged on the second semiconductor layer 19. When one polarity of the AC input passes from conducting region α to conducting region β, the current flows through the LED cells 11 in the following order: A→C1→C2→C3→C→B. The largest potential difference of the LED cells 11 occurs between LED cells A and B. As shown in FIG. 1, the serially-connected LED array further comprises a serially-connected sub-array with four LED cells 11 (C1, C2, C3, C) intervening the terminal LED cells A and B in the series connection.

As shown in FIG. 1, LED A and LED B further comprise a first side (A1, B1) and a second side (A2, B2), respectively. The first sides (A1, B1) of LED A and LED B neighbor to the sub-array, and the second sides (A2, B2) of LED A and LED B neighbor to each other. Besides, a trench T is formed between LED A and LED B. Namely, the trench T is formed between the second sides of LED A and LED B.

Normally, the forward voltage for one LED cell 11 is about 3.5 volt, so the voltage difference between LED cells A and B should be about 3.5*6=21 volts under normal working situation. Because the distance between LED cells A and B is very short (about 10~100 μm), the electric field strength (E=V/D, V=potential difference, D=distance) between LED cells A and B is high.

Besides, if there is suddenly a strong electrostatic field from the outside environment (such as from the human body or the working machine) injecting into the conducting region α, an ultra-high electrical voltage is further inputting to LED cell A, and causes the largest potential difference between LED cells A and B. When the value of the electric field strength reaches a certain value by the strong electrostatic field from the outside environment, the mediums (air, glue, or other dielectric materials) therebetween may be ionized, and parts of LED cells A and B within the electrical field strength are damaged (the damage region 12) by discharging, which is called the ESD (electrostatic discharge) damage. The SEM picture of the ESD damage situation is shown in FIG. 2, wherein the ordinary current flow 14 flows in the direction as the arrows indicated in the figure.

SUMMARY OF THE DISCLOSURE

The present disclosure provides a light emitting device, including a serially-connected LED array comprising a plurality of LED cells on a substrate. The serially-connected LED array includes a first LED cell, a second LED cell, and a serially-connected LED sub-array comprising at least three LED cells intervening between the first and second LED cell; and a plurality of conducting metals formed on the LED cells to electrically connect the plurality of LED cell in series; wherein among the LED sub-array which are continuously and sequentially connected by the conducting metals, each LED cell connects to a previous LED cell by a first connecting direction and connects to a next LED cell by a second connecting direction, the first connecting direction is not parallel to the second connecting direction.

The present disclosure provides another light emitting device, including a substrate; a plurality of LED cells formed on the substrate and arranged in an array; and a plurality of conducting metals formed on the LED cells to electrically connect the plurality of LED cell in series, and each conducting metal which directly connects two adjacent LED cells defining a connecting direction; wherein the plurality of LED cells comprises N LED cells, wherein the N LED cells are continuously and sequentially connected by the conducting metals, wherein N≥6 and the connecting directions change N−2 times.

The present disclosure provides a light emitting device, including a single substrate; an LED array disposed on the single substrate including a plurality of LED cells connected in series; wherein each LED cell includes a first edge, a second edge, a third edge, and a fourth edge, wherein the first edge and the third edge are opposite, the second edge and the fourth edge are opposite; and wherein the plurality of LED cells includes a first one and a second one of the LED cells, the first edge of the first one of the LED cells is adjacent to the third edge of the second one of the LED cells; a first trench, disposed between the first one of the LED cells and the second one of the LED cells; and a first conducting metal, disposed on the first trench, the first edge of the first one of the LED cells and the third edge of the second one of the LED cells, and electrically connecting the first one of the LED cells and the second one of the LED cells in series; wherein each of the LED cells includes a first semiconductor layer, a second semiconductor layer and an active layer formed therebetween; wherein the first one of the LED cells and/or the second one of the LED cells includes a round corner in a top view.

DETAILED DESCRIPTION OF PREFERRED EMBODIMENTS

The embodiments are described hereinafter in accompany with drawings. To better and concisely explain the disclosure, the same name or the same reference number given or appeared in different paragraphs or figures along the specification should has the same or equivalent meanings while it is once defined anywhere of the disclosure.

Figure 1:
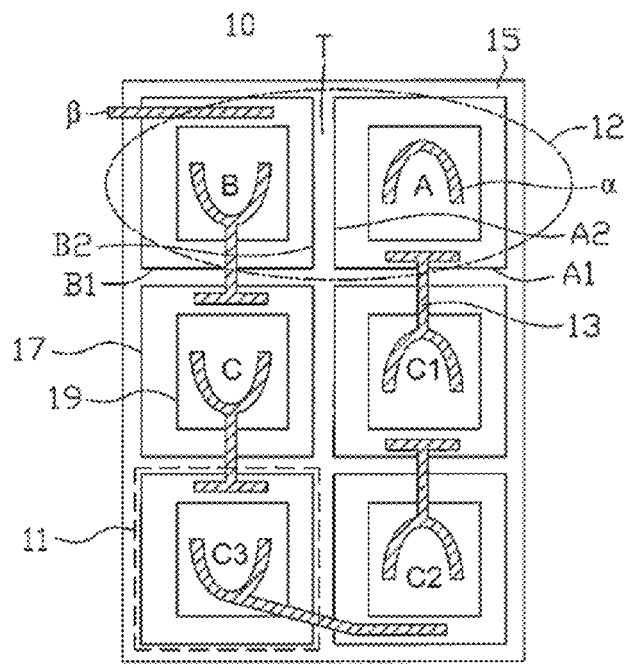
FIG. 1 illustrates the structure of a conventional light emitting device.
Figure 2:
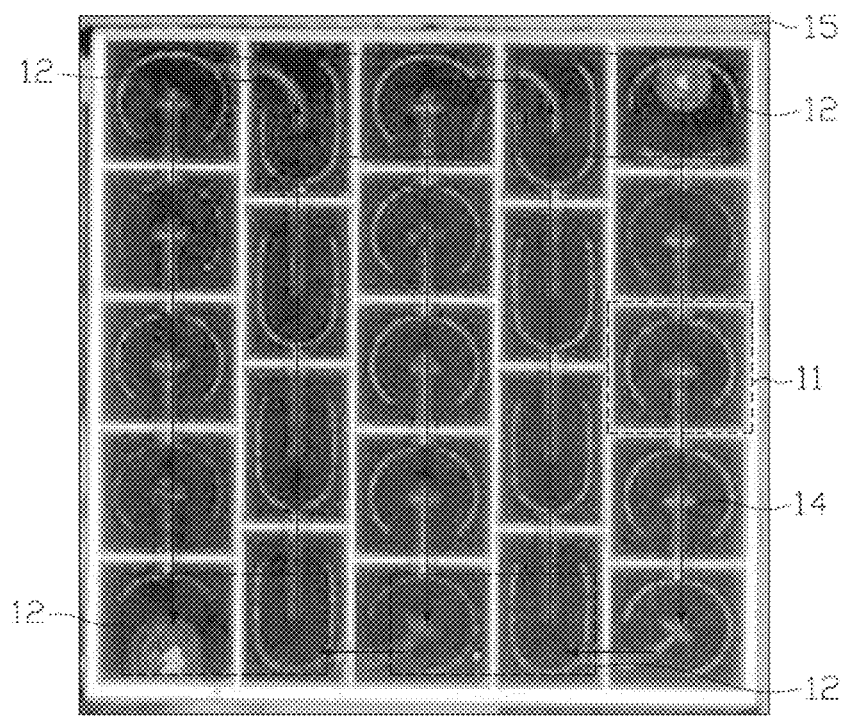
FIG. 2 illustrates an SEM picture of a light emitting device in accordance with an embodiment of the disclosure.
Figure 3:
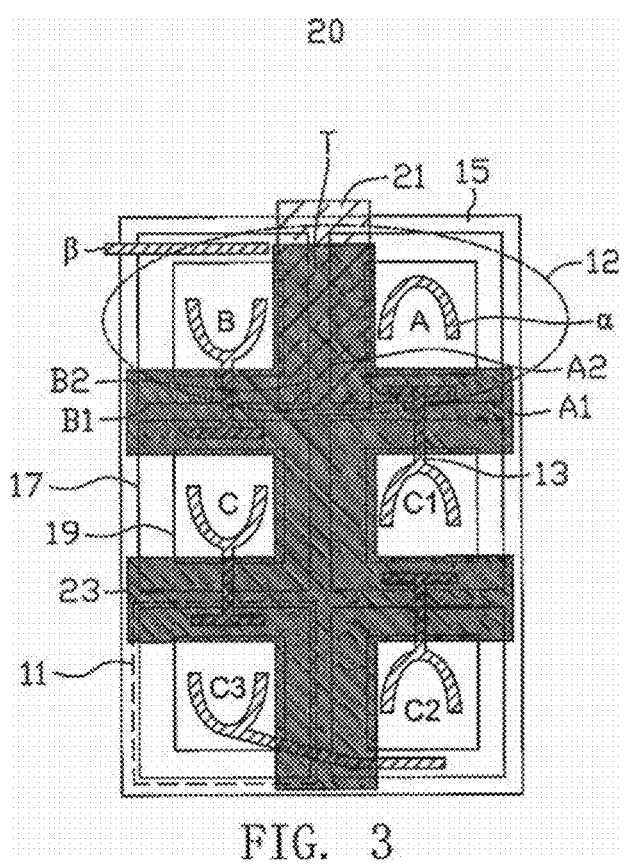
FIG. 3 illustrates a light emitting device in accordance with an embodiment of the disclosure.

In order to solve the ESD damage problem, FIG. 3 shows a light emitting device 20 in accordance with one embodiment of the present disclosure. The light emitting device 20 comprises a plurality of LED cells 11 (A, B, C, C1, C2, C3) connecting in series by conducting metals 13 on a single substrate 15, wherein each LED cell 11 comprises a first semiconductor layer 17 on the substrate 15, a second semiconductor layer 19 on the first semiconductor layer 17, an active layer 47 (not shown in FIG. 3) arranged between the first semiconductor layer 17 and the second semiconductor layer 19, and a conducting metal 13 arranged on the second semiconductor layer 19. As can be seen in FIG. 3, each conducting metal 13 further comprises the extending part with at least two divided metal lines. The number of the divided metal lines extended from each extending part is not limited to what is disclosed herein. In order to have the LED array connected in series, the first semiconductor layer 17 of LED A is electrically connected to the second semiconductor layer 19 of the adjacent LED cell, for example, LED C1. When one polarity of the AC input passes from conducting region α to conducting region β, the current flows through the LED cells 11 in the following order: A→C1→C2→C3→C→B. The largest potential difference of the LED cells 11 occurs between LED cells A and B. As shown in FIG. 3, the serially-connected LED array further comprises a serially-connected sub-array with four LED cells 11 (C1, C2, C3, C) intervening the terminal LED cells A and B in the series connection.

As shown in FIG. 3, LED A and LED B further comprise a first side (A1, B1) and a second side (A2, B2), respectively. The first sides (A1, B1) of LED A and LED B neighbor to the sub-array and the second sides (A2, B2) of LED A and LED B neighbor to each other. Besides, a trench T is formed between LED A and LED B. Namely, the trench T is formed between the second sides of LED A and LED B.

To prevent the ESD damage, a protecting structure is formed near the trench T to prevent the light emitting device from being damaged at a region near the trench by a surge voltage higher than a normal operating voltage. In this embodiment, a first insulating layer 23 is formed between the LED cells, and a second insulating layer 21 is further formed over the first insulating layer 23 in the region between two LED cells 11 with high electrical field strength, for example, the trench T. The second insulating layer 21 can be optionally thicker than the first insulating layer 23. Taking the light emitting device 20 in FIG. 3 for instance, LED A and LED B are electrically connected in series with four (more than three) LED cells 11 connected in-between and therefore suffer a high electric field strength over a certain value, and therefore the second insulating layer 21 is formed to cover the part of the top surfaces of the first insulating layer 23 and part of the top surfaces of LED A and LED B to isolate the LED cells 11 from the ESD damage. Besides, without the first insulating layer 23, the second insulating layer 21 only can also be the protecting structure to cover the region between two LED cells 11 with high electrical field strength, for example, the exposed surfaces of the substrate 15, the side surface of the first semiconductor layer 17, and the side surface of the second semiconductor layer 19 between LED cells A and B. Besides, the materials of the insulating layer 21 and/or 23 can be insulating materials such as $AlO_{x1}$, $SiO_{x2}$, $SiN_{x3}$, and so on, and the insulating layer 21 and/or 23 may be a composite structure with multi layers formed by different materials. For example, the second insulating layer 21 may be formed by the combination of one layer of $SiO_{x4}$ with the thickness of 2100 Å and one layer of $AlO_{x5}$ with the thickness of 2000 Å, and the first insulating layer 23 may be formed by only one layer of $SiO_{x4}$ with the thickness of 2100 Å. (The index words X1-X5 here are numbers, which could be integers or decimals, and can be the same or different.)

Figure 4:
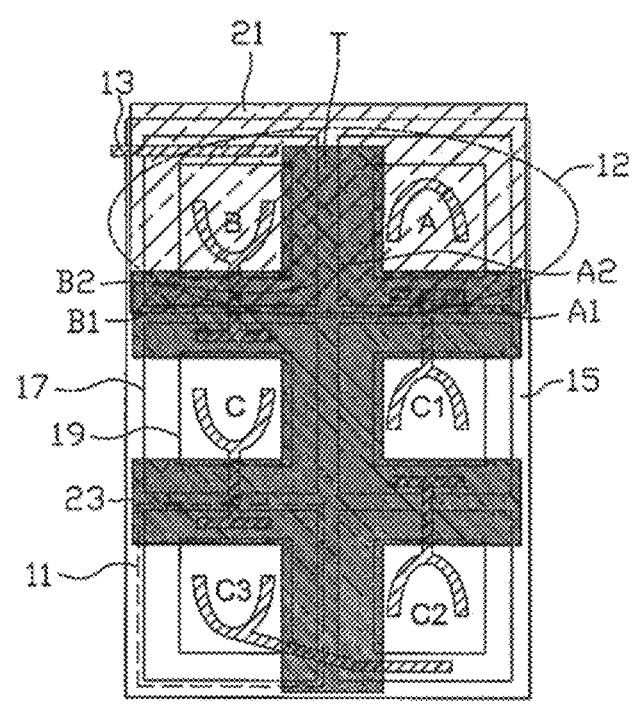
FIG. 4 illustrates a light emitting device in accordance with an embodiment of the disclosure.

FIG. 4 shows a light emitting device 30 in accordance with another embodiment of the present disclosure. As can be seen, the second insulating layer 21 covers most part of the top surfaces of LED A and LED B. For the same reason mentioned above, the insulating layers 21 and 23 can also be a composite structure with multi layers formed by different materials or a thick single layer, and the number or the thickness of the second insulating layer 21 on the covered top surfaces of LED A and LED B can be more than those in other regions.

Figure 5:
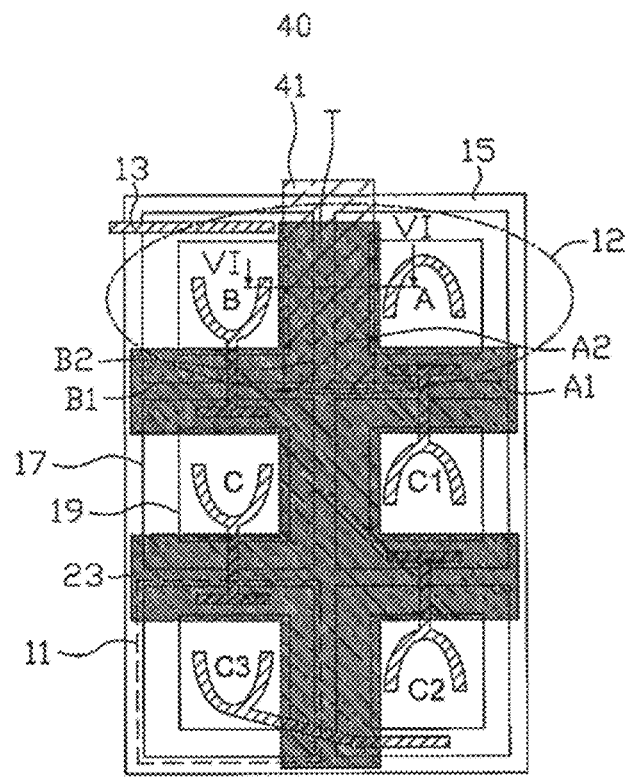
FIG. 5 illustrates a light emitting device in accordance with an embodiment of the disclosure.

FIG. 5 shows a light emitting device 40 in accordance with another embodiment of the present disclosure. In the embodiment, reducing the electrical field strength is another method to prevent the ESD damage. As shown in FIG. 5, an insulating wall 41 is formed between LED A and LED B (the region with a high electric field strength or between two adjoining LED cells 11 which are electrically connected in series and with more than three LED cells 11 connected in-between). Because the insulating wall 41 is formed by the insulating material, the electric lines originating from LED A cannot be directed to LED B by penetrating the insulating wall 41 directly and should be extended along the contours of the insulating wall 41 instead. The length of the electric line is extended, and therefore the electrical field strength (E=V/D, V=potential difference, D=distance) between LED A and LED B is reduced. In order to extend the length of the electric lines between LED A and LED B, the insulating wall 41 located between LED A and LED B should be formed at the shortest route from LED A to LED B to shield the electric lines coming from LED A or LED B. In other words, as shown in FIG. 5, the thickness of the insulating wall 41 in the trench should be substantially larger than the sum of the thickness of the first semiconductor layer 17, the active layer 47, the second semiconductor layer 19, and the conducting metal 13. Preferably, the thickness of the insulating wall 41 in the trench should be larger than 1.5 times the sum of the thicknesses of the first semiconductor layer 17, the active layer 47, the second semiconductor layer 19, and the conducting metal 13.

Figure 6:
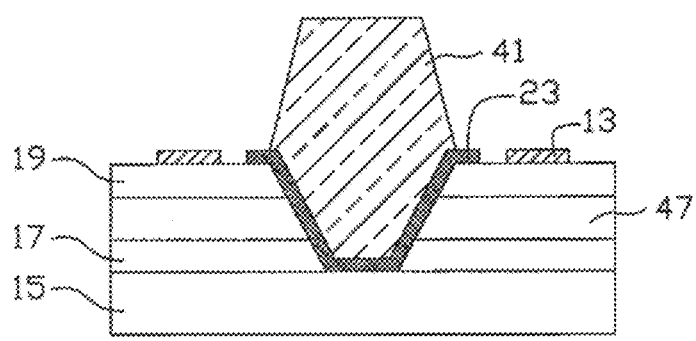
FIG. 6 illustrates a cross-section of a light emitting device along line 6-6' in FIG. 5 in accordance with an embodiment of the disclosure.

FIG. 6 is the cross-section of the 6-6' line shown in FIG. 5. In FIG. 6, the first insulating layer 23 covers conformably along the side walls of LED A and LED B (including the first semiconductor layers 17, the second semiconductor layers 19, and the active layers 47), part of the top surfaces of the LED A and LED B, and part of the top surface of the substrate in the trench T directly. Besides, the insulating wall 41 can be formed on the first insulating layer 23 and is higher than the LED A and LED B, therefore, the electric lines from LED A to LED B can be shielded by the insulating wall 41. However, the exact position of the insulating wall 41 can be modified and should not be limited. For example, the insulating wall 41 can also be formed on the top surface of the substrate 15 directly, or the insulating wall 41 can have a specific pattern formed by the traditional CVD method and the photolithography method.

Figure 7:
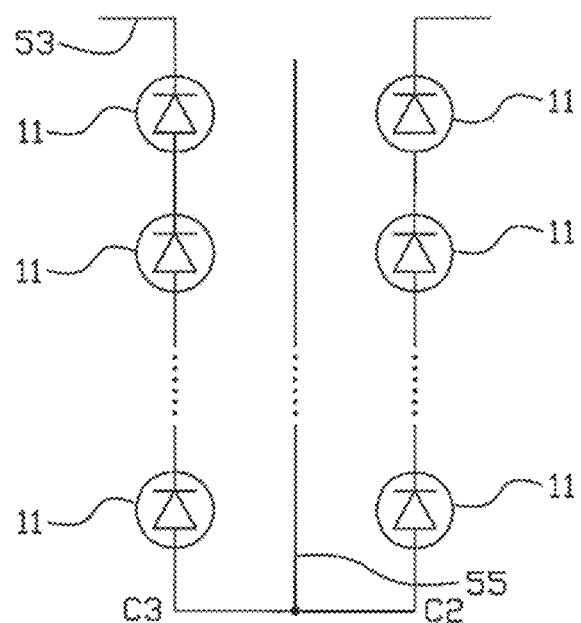
FIG. 7 illustrates an electric circuit of a light emitting device in accordance with an embodiment of the disclosure.

FIG. 7 shows an electric circuit of a light emitting device 50 in accordance with another embodiment of the present disclosure. As the experimental result indicates, a floating conductive line 55 electrically connecting to the LED cell 11 with the electric potential level between the highest potential and the lowest potential and located between the LED cell 11 with the highest potential and the LED cell 11 with the lowest potential can reduce the ESD damage. As shown in FIG. 7, a floating conductive line 55 can connect to the conducting metal 13 between LED C2 and LED C3.

Figure 8:
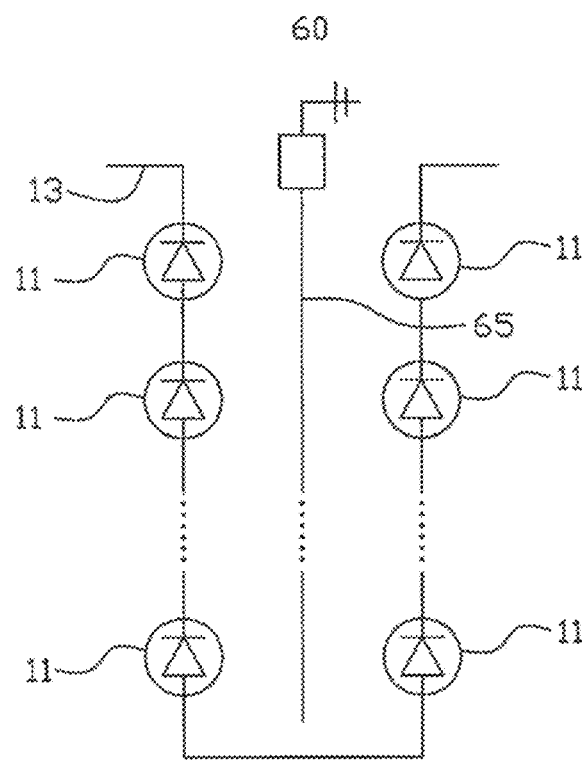
FIG. 8 illustrates an electric circuit of a light emitting device in accordance with an embodiment of the disclosure.

Similar to FIG. 7, FIG. 8 is an electric circuit of a light emitting device 60 in accordance with another embodiment of the present disclosure. Rather than forming a floating conductive line 55 connecting to the conducting metal 13, one grounding conductive line 65 is formed between the LED cell 11 with the highest potential and the LED cell 11 with the lowest potential, and the grounding conductive line 65 is grounded by connecting to outside.

Figure 9:
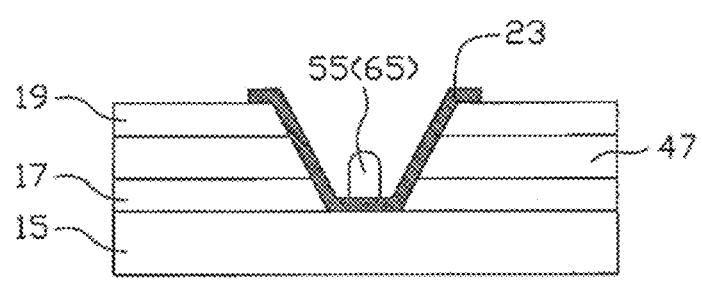
FIG. 9 illustrates a cross-section of a light emitting device in accordance with an embodiment of the disclosure.

FIG. 9 is the cross-section of the embodiment shown in FIG. 7 and FIG. 8. The floating (grounding) conductive line 55(65) can be formed on the insulating layer 23 or on the substrate 15 directly between two LED cells 11.

Figure 10A:
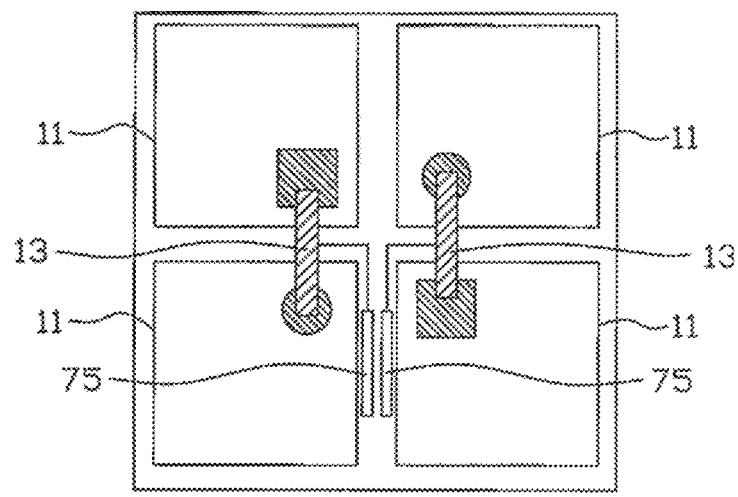
FIG. 10A illustrates a light emitting device in accordance with an embodiment of the disclosure.

FIG. 10A discloses a light emitting device 70 in accordance with another embodiment of the present disclosure. Since the ESD damage normally causes the failure of the LED and is not easy to be avoided, additional ESD damage regions 75 are formed to confine the ESD damage happened in the specific regions. As shown in FIG. 10A, there are two additional ESD damage regions 75 extending from the conductive metals 13. Because the two additional ESD damage regions 75 are facing to each other closely, the higher electric field strength is caused therebetween, and the ESD damage may happen between the additional ESD damage regions 75 more easily. The additional ESD damage regions 75 are two additional metal plates that do not function with the LED cells 11, therefore, they can help to maintain the working function of the LED cells 11. Besides, the edge of the additional ESD damage region 75 facing the other one can be roughened to form tips, which raises the probability of the ESD phenomenon happening in the predetermined regions.

Figure 10B:
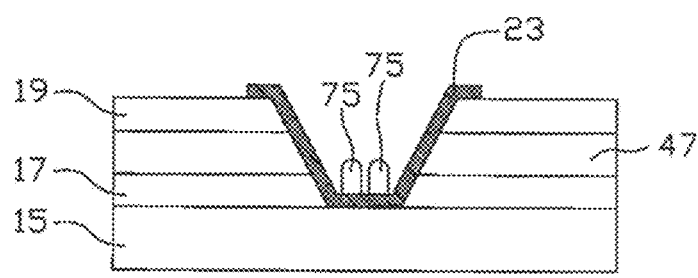
FIG. 10B illustrates a cross-section of a light emitting device in accordance with an embodiment of the disclosure.

FIG. 10B is the cross-section of the embodiment shown in FIG. 10A. The two additional ESD damage regions 75 are formed on the insulating layer 23 or on the substrate 15 directly between two LED cells 11.

Figure 11:
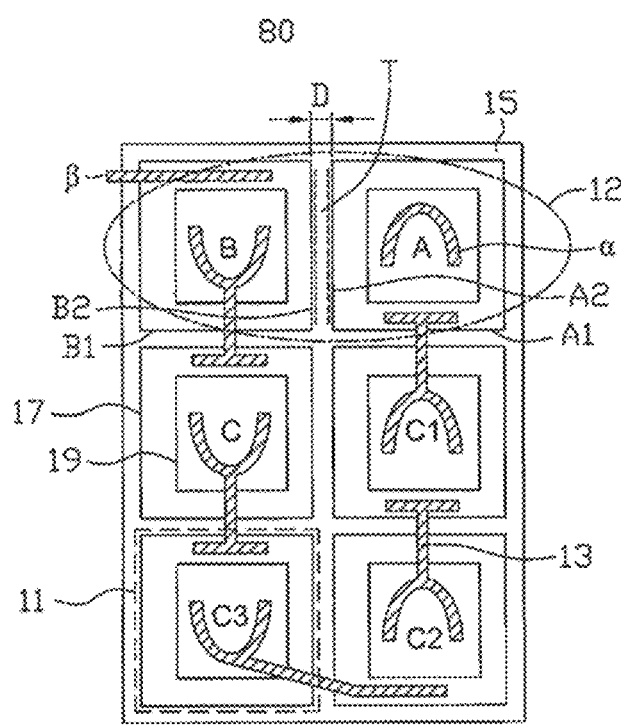
FIG. 11 illustrates a light emitting device in accordance with an embodiment of the disclosure.

FIG. 11 shows a light emitting device 80 in accordance with another embodiment of the present disclosure. Because the ESD damage comes from the high electric field strength, and the electric field strength between two objects depends on the potential difference and the distance of the two objects. As shown in FIG. 11, indicated by the experimental result, the distance (D) between two adjoining LED cells 11 with more than three LED cells 11 connected in-between should be larger than 15 µm. Preferably, the distance (D) between two adjoining LED cells 11 with more than three LED cells 11 connected therein should be more than 30 µm. The distance (D) here is identified as the shortest distance between two first semiconductor layers 17 of two adjoining LED cells 11. In addition, the "adjoining LED cells" here means any two LED cells 11 with the shortest distance from the first semiconductor layers 17 of the LED cell to the first semiconductor layer of the other LED cell, wherein the distance (D) is preferred to be smaller than 50 µm.

Figure 12:
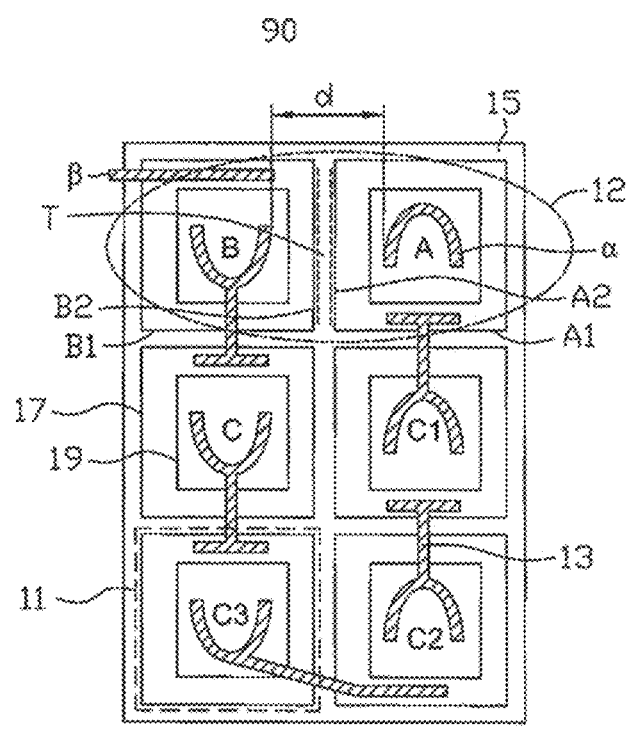
FIG. 12 illustrates a light emitting device in accordance with an embodiment of the disclosure.

FIG. 12 shows a light emitting device 90 in accordance with another embodiment of the present disclosure. Similar to the embodiment shown in FIG. 11, to prevent the ESD damage happened between the conducting metals 13 of the two adjoining LED cells 11, the distance (d) of the conducting metals 13 of the two adjoining LED cells 11 should be more than 100 µm. This design is suitable for the two adjoining LED cells 11 with large potential difference therebetween and/or with more than three LED cells 11 connected in-between. Preferably, the distance (d) of the conducting metals 13 of the two adjoining LED cells 11 should be more than 80 µm. The "distance of the conducting metals" here is defined as the shortest distance from the conducting metal 13 of the LED cell 11 to the conducting metal 13 of the adjoining LED cell. In addition, the "adjoining light-emitting diode cells" here means any two LED cells 11 with the shortest distance from the first semiconductor layers 17 of the LED cell 11 to the first semiconductor layer 17 of the other LED cell 11, wherein the distance (d) is preferred to be smaller than 50 µm.

Figure 13:
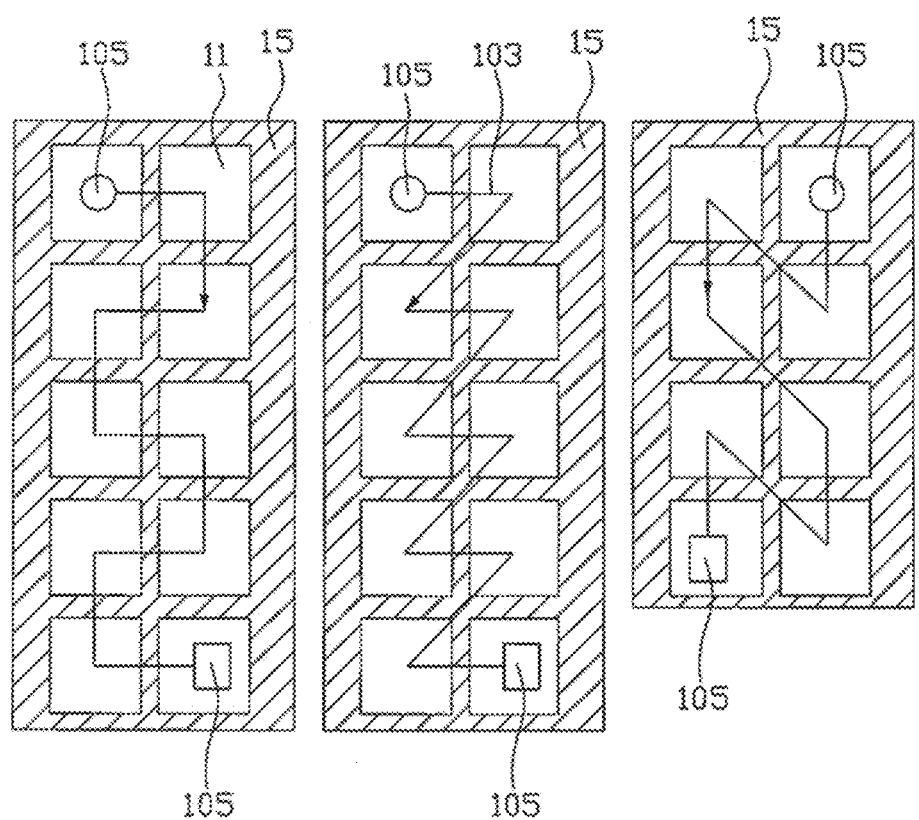
FIG. 13 illustrates light emitting devices in accordance with an embodiment of the disclosure.

As shown in FIG. 13, the high electric field strength often occurs between two adjoining LED cells 11 with more than three LED cells 11 connected in-between (with large potential difference), such as LED cells A and B shown in FIG. 12. In order to prevent the LED cells 11 with large potential difference from being too close, when a series of LED cells 11 formed on a substrate 15, the series of LED cells 11 should change its arranging direction when certain amount of LED cells 11 are aligned with one direction, for example, which more than three LED cells 11 aligned with. In other words, the arranging direction of the series of the LED cells 11 should be changed often to avoid any two LED cells 11 with large potential difference or with more than three LED cells 11 connected in-between located adjoining to each other. FIG. 13 shows three diagrams of different arrange configurations of a series LED cells 11 on a single substrate 15 in accordance with embodiments of the present disclosure. In each diagram, a series of the LED cells 11 disposed (formed by epitaxy or attached to the substrate by metal bonding or glue bonding) on a single substrate 15 with the bonding pads 105 formed at two ends of the series of the LED cells. The arrow here indicates the extending direction 103 (the connection order) of the LED cells 11. In each arrangement, any two of the adjoining LED cells do not have the large potential difference therebetween. In detail, as shown in FIG. 13, each serially-connected LED array comprises at least eight LED cells and at least more than two branches. In order not to let any two of the adjoining LED cells have too large potential difference therebetween, each LED array shown in the figure changes its arranging direction with every two successive LED cells.

Figure 14:
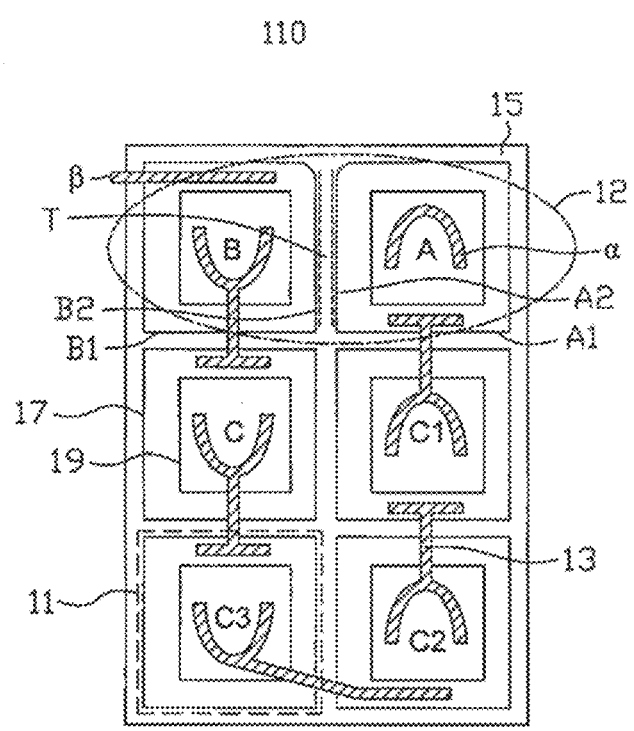
FIG. 14 illustrates a light emitting device in accordance with an embodiment of the disclosure.

FIG. 14 shows a light emitting device 110 in accordance with another embodiment of the present disclosure. According to the surface electric charge distribution of the objects, the surface electric discharge density per unit area of the object is large when the object has a small curvature radius. Another cause of the damage of the LED cells 11 called "point discharge" often happens at the position with high surface electric discharge density per unit area. Therefore, to prevent the "point discharge" phenomenon, the contours of the LED cells 11 are modified in this embodiment. As shown in FIG. 14, the upper corners of the first semiconductor layer 17 between LED cells A and B are patterned, for example, rounded. The above modification is not limited to the identified positions, and all of the corners of the LED cells 11 can be patterned to be rounded. Furthermore, not only the first semiconductor layer 17 but the second semiconductor layer 19 can also be rounded, especially for the edges of the LED cell close to the second side, which has the smaller distance from the adjoining LED cell. Preferably, the radius of the curvature of the patterned corner is not less than 15 µm.

Figure 15:
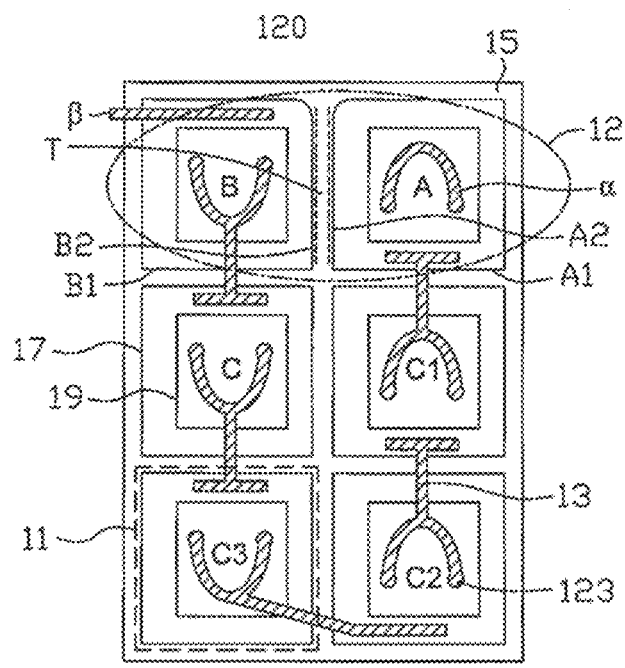
FIG. 15 illustrates a light emitting device in accordance with an embodiment of the disclosure.

With the similar concept of the embodiment disclosed in FIG. 14, to prevent the "point discharge" phenomenon, FIG. 15 shows that the terminal 123 of each divided metal line of the LED cells 11 can be patterned by forming the round metal plates 123. The shape of the terminal metal 123 is not limited to the round shape. As indicated by the experimental result, any shape of the terminal metal 123 formed at the terminal with the enlarged portion or the radius larger than the line width of the conducting metal 13 can be formed to reduce the "point discharge" damage.

Figure 16:
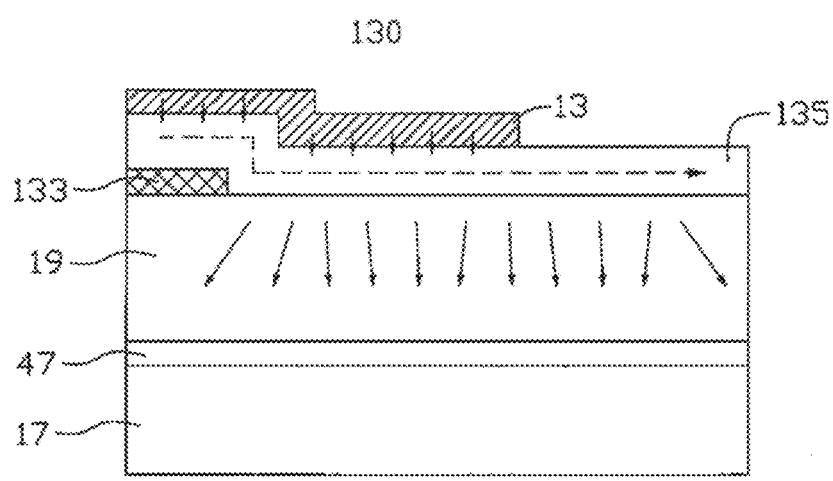
FIG. 16 illustrates a cross-section of a light emitting device in accordance with an embodiment of the disclosure.

FIG. 16 shows a cross-section of a light emitting device 130 in accordance with another embodiment of the present disclosure. In order to reduce the undesirable discharge, a smoother path facilitating the current flow can help. As shown in FIG. 16, in order to let the current spread from the conducting metal widely, a current blocking layer 133 is provided beneath the conducting metal 13. The current blocking layer 133 is made by a dielectric material which is an insulator, such as $SiO_{y1}$ or $SiN_{y2}$. However, the current blocking layer also blocks most paths that the current flows. If the current cannot disperse along the normal path, it leaks out in other forms such as ESD or point discharge. Therefore, in this embodiment, the current blocking layer 133 is formed beneath the conducting metal 13, not under the terminal of the conducting metal 13. This design let the current at the terminal of the conducting metal 133, where the discharge is caused most easily, to flow more smoothly and reduce the probability the current leaking out along the discharge path. Besides, a transparent conducting layer 135 such as ITO, IZO, ZnO, AZO, thin metal layer, or the combination thereof can also be optionally formed on the second semiconductor layer to help the current spreading.

The embodiments mentioned above are used to describe the technical thinking and the characteristic of the invention and to make the person with ordinary skill in the art to realize the content of the invention and to practice, which could not be used to limit the claim scope of the present invention. That is, any modification or variation according to the spirit of the present invention should also be covered in the claim scope of the present disclosure. For example, the electric connecting method is not limited to the serial connection. The ESD protection methods shown as the embodiments above can be applied to any two adjoining light emitting diode cells with a high electric field strength over a certain value or with more than three LED cells connected in-between electrically connect in parallel or in the combination of serial and parallel.

What is claimed is:

1. A light emitting device, comprising:
    a single substrate;
    an LED array disposed on the single substrate, comprising a plurality of LED cells connected in series; wherein each LED cell comprises a first edge, a second edge, a third edge, and a fourth edge, wherein the first edge and the third edge are opposite, the second edge and the fourth edge are opposite; and wherein the plurality of LED cells comprises a first one and a second one of the LED cells, the first edge of the first one of the LED cells is adjacent to the third edge of the second one of the LED cells;
    a first trench, disposed between the first one of the LED cells and the second one of the LED cells; and
    a first conducting metal, disposed on the first trench, the first edge of the first one of the LED cells and the third edge of the second one of the LED cells, and electrically connecting the first one of the LED cells and the second one of the LED cells in series;
    wherein each of the LED cells comprises a first semiconductor layer, a second semiconductor layer and an active layer formed therebetween;
    wherein the first one of the LED cells and/or the second one of the LED cells comprises a round corner in a top view.

2. The light emitting device as claimed in claim 1 wherein the second one of the LED cells comprises a round corner in a top view.

3. The light emitting device as claimed in claim 1, wherein the round corner comprises a radius of curvature not less than 15 µm.

4. The light emitting device as claimed in claim 1 further comprising:
    a first insulating layer, filled in the first trench; and
    a second insulating layer, disposed on the first insulating layer; wherein the second insulating layer is thicker than the first insulating layer.

5. The light emitting device as claimed in claim 4, wherein each of the first one LED cell and the second one of the LED cell comprises a side wall near the first edge of the first one of the LED cells and the third edge of the second one of the LED cells, respectively, and the first insulating layer covers the side walls conformably.

6. The light emitting device as claimed in claim 1, wherein the plurality of LED cells further comprises a third one of the LED cells adjacent to the first one of the LED cells, and the second edge of the first LED cell is adjacent to the fourth edge of the third one of the LED cells.

7. The light emitting device as claimed in claim 6, wherein the third one of the LED cells comprises a round corner.

8. The light emitting device as claimed in claim 6, further comprising a second trench, disposed between the first one of the LED cells and the third one of the LED cells; and a second conducting metal disposed on the second trench, the second edge of the first one of the LED cells and the fourth edge of the third one of the LED cells, and electrically connecting the first one of the LED cells and the third one of the LED cells.

9. The light emitting device as claimed in claim 8, wherein the plurality of the LED cells further comprises a fourth one of the LED cells, and the fourth one of the LED cells is adjacent to the second one of the LED cells; wherein a third trench is disposed between the second edge of the second one of the LED cells and the fourth edge of the fourth one of the LED cells; and wherein a third conducting metal is disposed on the third trench, the second edge of the second one of the LED cells and the fourth edge of the fourth one of the LED cells, and electrically connects the second one of the LED cells and the fourth one of the LED cells.

10. A light emitting device as claimed in claim 9, wherein the second conducting metal and the third conducting metal both extend along a direction parallel with the first edge of the first one of the LED cells.

11. A light emitting device as claimed in claim 9, wherein the plurality of LED cells further comprises a fifth one of the LED cells and a sixth one of the LED cells.

12. The light emitting device as claimed in claim 6, wherein the plurality of LED cells further comprises a fourth one of the LED cells and wherein the fourth one of the LED cells is adjacent to the third one of the LED cell, the first edge of the third one of the LED cell is adjacent to the third edge of the fourth one of the LED cells.

13. The light emitting device as claimed in claim 12, further comprising a second trench, disposed between the first edge of the third one of the LED cells and the third edge of the fourth one of the LED cells; and
   a second conducting metal, disposed on the second trench and electrically connecting the third one of the LED cells and the fourth one of the LED cells.

14. A light emitting device as claimed in claim 13, wherein the first conducting metal and the second conducting metal both extend along a direction parallel with the second edge of the first one of the LED cells.

15. A light emitting device as claimed in claim 9, further comprising a first insulating layer, filled in the first trench; and a second insulating layer, disposed on the first insulating layer; wherein the first insulating layer and the second insulating layer comprise different material, and wherein the material of the first insulating layer and the second insulating layer comprises $AlO_{x1}$, $SiO_{x2}$ or $SiN_{x3}$.

16. A light emitting device as claimed in claim 9, wherein the plurality of LED cells further comprises a fifth one of the LED cells adjacent to the fourth one of the LED cells, wherein a fourth trench is disposed between the first edge of the fourth one of the LED cells and the third edge of the fifth one of the LED cells; and a fourth conducting metal is disposed on the fourth trench, the first edge of the fourth one of the LED cells and the third edge of the fifth one of the LED cells, and electrically connects the fourth one of the LED cells and the fifth one of the LED cells.

17. A light emitting device as claimed in claim 16, where one of the second one, the third one, the fourth one and the fifth one of the LED cells comprises a round corner.

18. A light emitting device as claimed in claim 16, wherein the first conducting metal and the fourth conducting metal extend along a direction parallel with the second edge of the first one of the LED cells, and wherein the second conducting metal and the third conducting metal extend along a direction parallel with the first edge of the first one of the LED cells.

19. The light emitting device as claimed in claim 1 further comprising a current blocking layer disposed under the conducting metal, and wherein the current blocking layer is disposed behind a terminal of the conducting metal.

20. The light emitting device as claimed in claim 1, wherein shapes of the first one and the second one of the LED cells are different.

* * * * *